US009826830B1

(12) United States Patent

Stiefel et al.

(10) Patent No.: US 9,826,830 B1

(45) Date of Patent: *Nov. 28, 2017

(54) STORAGE RACK FOR BARRELS

(71) Applicant: Heritage Distilling Company, Inc., Gig Harbor, WA (US)

(72) Inventors: Justin B. Stiefel, Gig Harbor, WA (US); Darrin Filand, Gig Harbor, WA (US); Carl Taylor-Swanson, Tacoma, WA (US)

(73) Assignee: Heritage Distilling Company, Inc., Gig Harbor, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/261,271

(22) Filed: Sep. 9, 2016

Related U.S. Application Data

(63) Continuation of application No. 13/844,655, filed on Mar. 15, 2013, now Pat. No. 9,445,670.

(51) Int. Cl.

| | |
|---|---|
| ***A47B 81/00*** | (2006.01) |
| ***A47F 7/28*** | (2006.01) |
| ***A47F 5/08*** | (2006.01) |
| ***A47F 10/00*** | (2006.01) |
| ***H05K 5/00*** | (2006.01) |
| ***G09F 7/18*** | (2006.01) |

(52) U.S. Cl.

CPC .............. *A47B 81/007* (2013.01); *A47F 5/08* (2013.01); *A47F 7/283* (2013.01); *A47F 10/00* (2013.01); *G09F 7/18* (2013.01); *H05K 5/0017* (2013.01); *A47B 2220/0091* (2013.01); *G09F 2007/1856* (2013.01)

(58) Field of Classification Search

CPC ..... A47B 73/00; A47B 73/002; A47B 73/004; A47B 73/006; A47B 73/008; A47B 81/007; A47F 7/04

USPC .... 211/74, 75, 85.22; 312/234.1, 234.4, 281

See application file for complete search history.

(56) References Cited

U.S. PATENT DOCUMENTS

| | | | |
|---|---|---|---|
| 221,945 | A | 11/1879 | Stitzel |
| 232,569 | A | 9/1880 | Thomas |
| 244,662 | A | 7/1881 | Pottinger |
| 520,098 | A | 5/1894 | Warner |

(Continued)

OTHER PUBLICATIONS

"Hole", www.Dictionary.com, accessed Jan. 10, 2016, http://dictionary.reference.com/browse/hole?s=t, 8 pages.

(Continued)

*Primary Examiner* — Joshua Rodden

(74) *Attorney, Agent, or Firm* — Sheppard Mullin Richter & Hampton LLP

(57) ABSTRACT

A storage rack may include a plurality of sections for holding a respective plurality of items. A first section may include, for example, a first vertical support, a second vertical support substantially parallel to the first vertical support, and a first set of horizontal supports substantially perpendicular to the first vertical support and the second vertical support. The first set of horizontal supports may include a first horizontal support disposed at a first height and a first depth in the first vertical support, and a second horizontal support disposed at the first height and the first depth in the second vertical support. The first horizontal support may extend from an inner wall of the first vertical support towards the second vertical support for a distance that is less than half of the distance between the first vertical support and the second vertical support.

16 Claims, 11 Drawing Sheets

(56) References Cited

U.S. PATENT DOCUMENTS

| | | | |
|---|---|---|---|
| 840,696 | A | 1/1907 | Heberling |
| 1,075,801 | A | 10/1913 | Waters |
| 1,133,598 | A | 3/1915 | Winslow |
| 1,193,498 | A | 8/1916 | Bales |
| 1,220,450 | A | 3/1917 | Pavey |
| 1,791,336 | A | 2/1931 | Nathaniel |
| 1,921,222 | A | 8/1933 | De |
| 2,119,883 | A | 6/1938 | Henry |
| 3,368,690 | A | 2/1968 | Konstant |
| 3,804,482 | A | 4/1974 | Smith |
| 4,022,327 | A | 5/1977 | Anderson |
| 4,482,065 | A | 11/1984 | Altemose |
| 5,310,300 | A | 5/1994 | Crabb |
| D374,594 | S | 10/1996 | Munoz |
| 6,360,903 | B1 | 3/2002 | Flores |
| 6,523,706 | B2 | 2/2003 | Flores |
| 6,637,607 | B2 | 10/2003 | Tombu |
| 6,729,481 | B1 | 5/2004 | OBrien |
| 7,641,059 | B2 | 1/2010 | GraciaLecina |
| 7,673,761 | B2 | 3/2010 | Lee |
| 8,132,871 | B1 | 3/2012 | Caruso |
| 2005/0184020 | A1 | 8/2005 | Thibodeau |
| 2005/0263471 | A1 | 12/2005 | Schmidt |
| 2007/0068888 | A1 | 3/2007 | Tombu |
| 2009/0308824 | A1 | 12/2009 | Van Belkom |
| 2010/0012600 | A1 | 1/2010 | Clontz |
| 2011/0166694 | A1 | 7/2011 | Griffits |
| 2011/0309220 | A1 | 12/2011 | Collini |
| 2014/0125599 | A1 | 5/2014 | Seeley |

OTHER PUBLICATIONS wineracks.com, published Feb. 23, 2011 and accessed via the Wayback Machine, https://web.archive.org/web/20111016153857/http://wineracks.com/commercial-wine-racks/gallery/series3/series3a.jpg, accessed on Jun. 28, 2015, 1 page.

STORAGE RACK FOR BARRELS

CROSS-REFERENCE TO RELATED APPLICATIONS

This application is a continuation of U.S. patent application Ser. No. 13/844,655, filed Mar. 15, 2013, entitled "STORAGE RACK FOR BARRELS," which issued as U.S. Pat. No. 9,445,670 B1 on Sep. 20, 2016, and which is hereby incorporated by reference herein in its entirety.

FIELD OF THE INVENTION

The invention relates to a storage rack for barrels, particularly barrels for aging spirits in a retail environment.

BACKGROUND OF THE INVENTION

Conventional storage racks for barrels may exist, but have various limitations and drawbacks. For example, conventional storage racks for barrels may be limited to comprising a bottom support for the barrel that extends from one end of a holder for the barrel to the other end. Often, certain barrels for aging spirits are not in view of businesses. These and other drawbacks exist.

SUMMARY OF THE INVENTION

According to an aspect of the invention, a storage rack may comprise a plurality of sections for holding barrels or other items. A first section may comprise, for example, a first vertical support, a second vertical support substantially parallel to the first vertical support, and a first set of horizontal supports substantially perpendicular to the first vertical support and the second vertical support. The first set of horizontal supports may comprise a first horizontal support disposed at a first height and a first depth in the first vertical support, and a second horizontal support disposed at the first height and the first depth in the second vertical support. The first set of horizontal supports may be in a same horizontal plane. The first horizontal support may extend from an inner wall of the first vertical support for the first section towards the second vertical support in a first direction, for a distance that is less than half of the distance between the first vertical support and the second vertical support. The second horizontal support may extend from an inner wall of the second vertical support towards the first vertical support in a second direction opposite the first direction, for a second distance that is less than half of the distance between the first vertical support and the second vertical support. Accordingly, the first set of horizontal supports may be disposed in the first section such that a gap exists between the first horizontal support and the second horizontal support. The first section may be configured to hold a first item, such that the first item is disposed on and/or supported by the first set of horizontal supports.

A first section and a second section may share one of the first vertical support or the second vertical support. In an implementation in which the first section and the second section share the first vertical support, the second section may comprise a third vertical support substantially parallel to the first vertical support and the second vertical support. The second section may comprise a second set of horizontal supports. The second set of horizontal supports may comprise a third horizontal support disposed at a first height and a first depth in the first vertical support, and a fourth horizontal support disposed at the first height and the first depth in the third vertical support. The second set of horizontal supports may be in a same horizontal plane. The third horizontal support may extend from an inner wall of the first vertical support for the first section towards the third vertical support for a distance that is less than half of the distance between the first vertical support and the third vertical support. The fourth horizontal support may extend from an inner wall of the second vertical support for the section towards the first vertical support for a second distance that is less than half of the distance between the first vertical support and the third vertical support. In one implementation, the shared first vertical support may comprise a first hole at the first height and the first depth at which the first horizontal support is disposed. In this implementation, the first horizontal support and the third horizontal support may be an integral support with a portion thereof disposed in the first hole.

In one implementation, the shared first vertical support may be substantially solid. In this implementation, the first horizontal support and the third horizontal support may be separate pieces. The first horizontal support may be fixably attached to the first vertical support, may be integrated with the first vertical support, and/or may otherwise be connected to the first vertical support. In an implementation in which the shared first vertical support is substantially solid, the first set of horizontal supports of the first section may be disposed at a first height of the first section and the second set of horizontal supports of the second section may be disposed at a second height different from the first height.

In one implementation, the vertical supports of the plurality of sections may be connected to one or more of a base of the storage rack or a back wall of the storage rack.

In one implementation, a first section may comprise one or more sets of horizontal supports. For example, the first section may comprise two sets of horizontal supports, each at a same height of the first section. In one example, the two sets of horizontal supports may be spaced equally apart with respect to a depth of the first section. In another example, the two sets of horizontal supports may each be spaced an equal distance from a respective front and back of the first section. The two sets of horizontal supports may be disposed at other locations in the first section as well. The locations of the two sets of horizontal supports are not limited to the examples described herein.

In one implementation, a first section may comprise three sets of horizontal supports, with each set of horizontal supports at a same height of the first section. In one example, the three sets of horizontal supports may be spaced equally apart with respect to a depth of the first section. In another example, a first set of horizontal supports of the three sets of horizontal supports may be spaced at a central depth of the section and the other two sets of horizontal supports may each be spaced an equal distance from a respective front and back of the first section. The three sets of horizontal supports may be disposed at other locations in the first section as well. The locations of the three sets of horizontal supports are not limited to the examples described herein.

In one implementation, a first section may comprise a single set of horizontal supports. In one example, a proximal end and a distal end of the single set of horizontal supports may be spaced an equal distance from a respective front and back of the first section. The single set of horizontal supports may be disposed at other locations in the first section as well. The locations of the single set of horizontal supports are not limited to the examples described herein.

In one implementation, a width of a horizontal support may vary from a first section to a second section. For example, a width of a horizontal support may be based upon one or more of a number of sets of horizontal supports in the section, an average weight of an item to be held by the section, a depth of the section, and/or other parameters related to the section.

A first section may be configured to hold a barrel or other item. For example, the first item may be a container such as a barrel, a cask, and/or other storage device. The container may be configured to hold one or more items. For example, the container may comprise a cylindrical structure configured to hold liquids, such as distilled spirits, wines, and/or other liquids that need to be "aged". In another example, the container may be configured to store any number and variety of items. A container may have a cylindrical shape, a circular shape, a cube shape, a cuboid shape, an ovoid shape, and/or any other shape.

According to an aspect of the invention, the storage rack may comprise one or more rows comprising the plurality of sections. In one implementation, a topmost row of the storage rack may be fixably attached to a ceiling of a room.

According to an aspect of the invention, the storage rack may comprise one or more columns comprising the plurality of sections. In one implementation, one of the rightmost column or the leftmost column may be fixably attached to a wall of a room.

In one implementation, the storage rack may comprise a platform extending from a front of the storage rack. The platform may comprise a substantially flat planar surface substantially parallel to the ground. For example, the platform may comprise a substantially horizontal surface upon which one or more items may be placed.

In one implementation, the storage rack may comprise one or more embedded displays. For example, the storage rack may comprise one or more embedded displays in the platform. In another example, an external side wall of the storage rack may comprise one or more embedded displays. In another example, a barrel stored in a section of the storage rack may comprise an embedded display.

In one implementation, the storage rack may store barrels for aging spirits in a retail environment. The retail environment may comprise equipment that enables a customer to participate in the production of customized spirits. The customized spirits may be stored in a barrel stored in the storage rack. As such, in one implementation, the barrels stored in the storage rack may correspond to barrels of customized spirits produced by one or more customers in the retail environment.

In one implementation, the storage rack may comprise one or more embedded displays disposed, for example, at a platform of the storage rack, at an external wall of the storage rack, on one or more barrels stored in the storage rack, and/or at other locations of the storage rack. One or more types of embedded displays may be disposed at the storage rack. The types of embedded displays may include, for example, an electronic display, a print display, and/or other type of display. The electronic display may facilitate the access of electronic data related to the retail environment, the barrels stored, a specific barrel, available distilled spirits in the stored barrels, the customization process associated with the distilled spirits held by a specific barrel, the production and/or customization of distilled spirits, information related to production of distilled spirits, education regarding distilled spirits, the barrels stored by the storage rack, users associated with the retail environment, batch management information related to one or more barrels stored at the storage rack, and/or other information related to the retail environment and/or its products.

In one implementation, a barrel stored in the storage rack may comprise identification information displayed thereon. The identification information may be used to access information related to the barrel, including one or more customers associated with the barrel, a customization process associated with the barrel, batch management information associated with the barrel, distilled spirits associated with the barrel, and/or other information associated with the barrel. In one implementation, information displayed via an embedded display may be updated via the embedded display. A print display may be established via interaction with a kiosk at the retail environment or another embedded display of the storage rack.

These and other aspects, features, and characteristics of the present invention, as well as the functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1A:
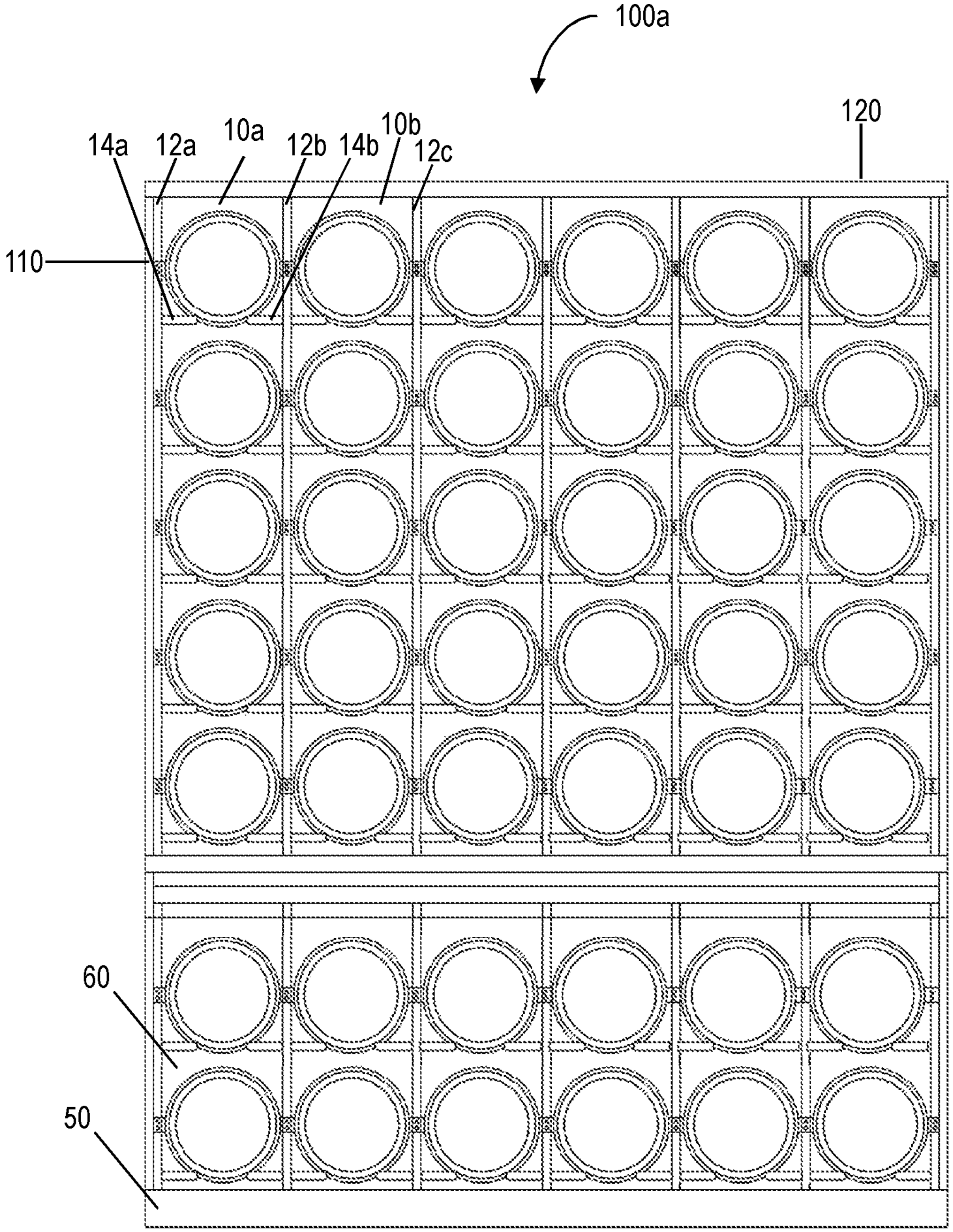
FIG. 1A illustrates an exemplary storage rack, according to an aspect of the invention.

FIG. 1A illustrates an exemplary storage rack 100*a*, according to an aspect of the invention. According to an aspect of the invention, the storage rack 100*a* may comprise a plurality of sections 10*a*, 10*b*, . . . , 10*n* for holding a respective plurality of items. A first section 10*a* may comprise, for example, a first vertical support 12*a*, a second vertical support 12*b* substantially parallel to the first vertical support, and a first set of horizontal supports 14*a*, 14*b* substantially perpendicular to the first vertical support 12*a* and the second vertical support 12*b*.

Figure 1B:
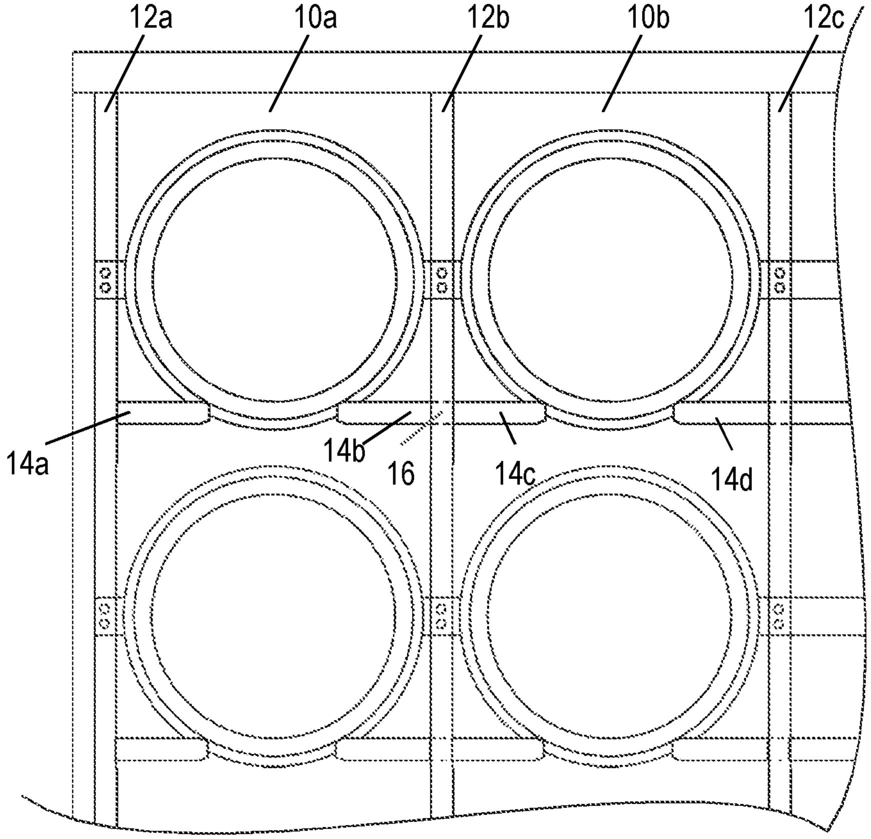
FIG. 1B illustrates an exemplary exploded view of a plurality of sections of the storage rack illustrated in FIG. 1A, according to an aspect of the invention.

FIG. 1B illustrates an exemplary exploded view of a plurality of sections 10*a*, 10*b*, . . . , 10*n* of the storage rack 100*a* illustrated in FIG. 1A, according to an aspect of the invention. As shown in FIG. 1A, the first set of horizontal supports may comprise a first horizontal support 14*a* disposed at a first height and a first depth in the first vertical support 12*a*, and a second horizontal support 14*b* disposed at the first height and the first depth in the second vertical support 12*b*. The first set of horizontal supports 14*a*, 14*b* may be in a same horizontal plane. The first horizontal support 14*a* may extend from an inner wall of the first vertical support 12*a* for the first section 10*a* towards the second vertical support 12*b* in a first direction, for a distance that is less than half of the distance between the first vertical support 12*a* and the second vertical support 12*b*. The second horizontal support 14*b* may extend from an inner wall of the second vertical support 12*b* towards the first vertical support 12*a* in a second direction opposite the first direction, for a second distance that is less than half of the distance between the first vertical support 12*a* and the second vertical support 12*b*. Accordingly, the first set of horizontal supports 14*a*, 14*b* may be disposed in the first section 10*a* such that a gap exists between the first horizontal support 14*a* and the second horizontal support 14*b*. The first section 10*a* may be configured to hold a first item, such that the first item is disposed on and/or supported by the first set of horizontal supports 14*a*, 14*b*.

A first section 10*a* and a second section 10*b* may share one of the first vertical support 12*a* or the second vertical support 12*b*. In an implementation in which the first section 10*a* and the second section 10*b* share the second vertical support 12*b*, the second section 10*b* may comprise a third vertical support 12*c* substantially parallel to the first vertical support 12*a* and the second vertical support 12*b*. The second section 10*b* may comprise a second set of horizontal supports 14*c*, 14*d*. The second set of horizontal supports 14*c*, 14*d* may comprise a third horizontal support 14*c* disposed at a first height and a first depth in the second vertical support 12*b*, and a fourth horizontal support 14*d* disposed at the first height and the first depth in the third vertical support 12*c*. The second set of horizontal supports 14*c*, 14*d* may be in a same horizontal plane. The third horizontal support 14*c* may extend from an inner wall of the second vertical support 12*b* for the second section 10*b* towards the third vertical support 12*c* for a distance that is less than half of the distance between the second vertical support 12*b* and the third vertical support 12*c*. The fourth horizontal support 14*d* may extend from an inner wall of the third vertical support 12*c* for the second section towards the second vertical support 12*b* for a second distance that is less than half of the distance between the second vertical support 12*b* and the third vertical support 12*c*. In one implementation, the shared second vertical support 12*b* may comprise a first hole 16 at the first height and the first depth at which the first horizontal support 14*a* is disposed. In this implementation, the second horizontal support 14*b* and the third horizontal support 14*c* may be an integral support with a portion thereof disposed in the first hole 16.

Figure 2A:
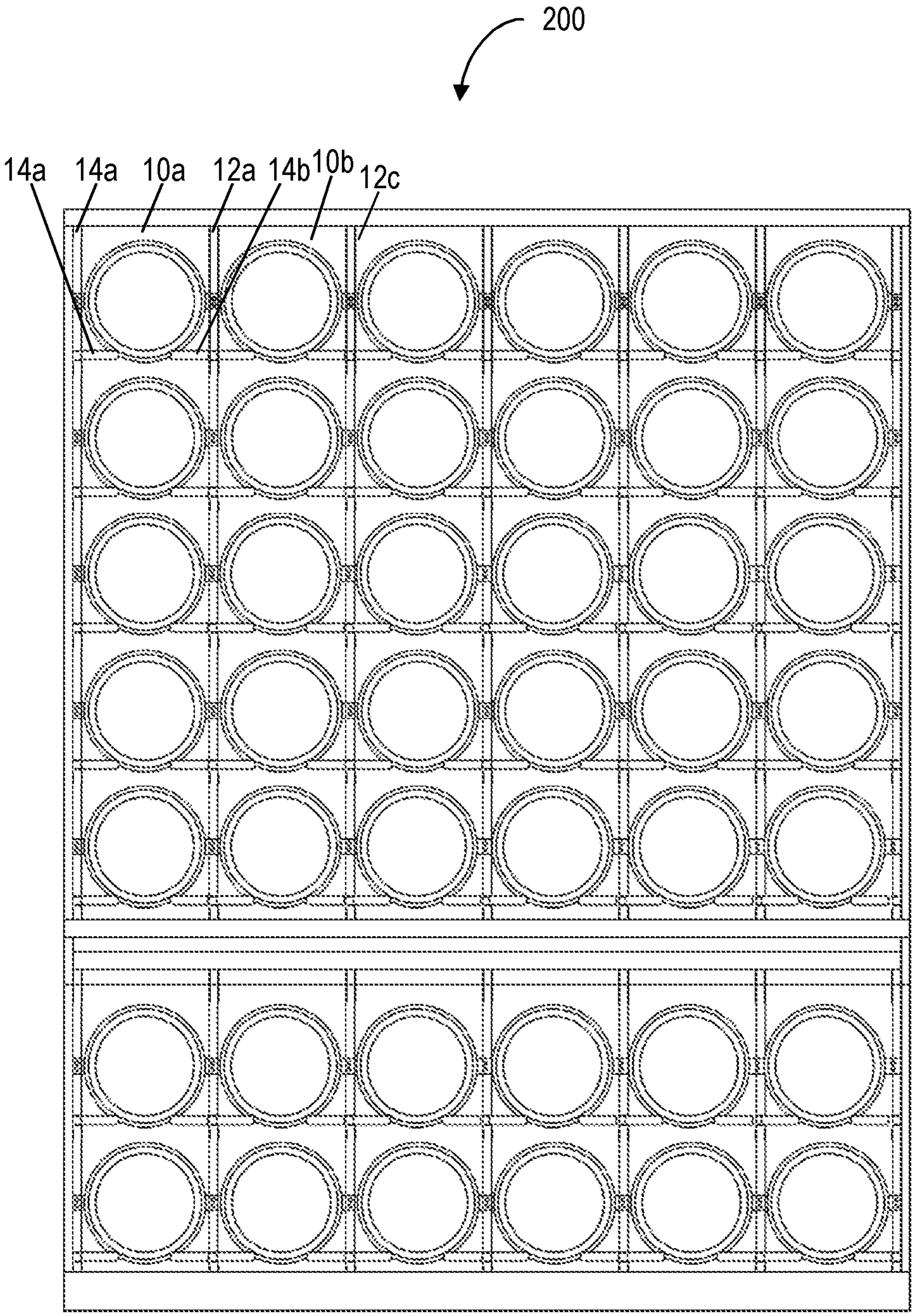
FIG. 2A illustrates an exemplary storage rack, according to an aspect of the invention.
Figure 2B:
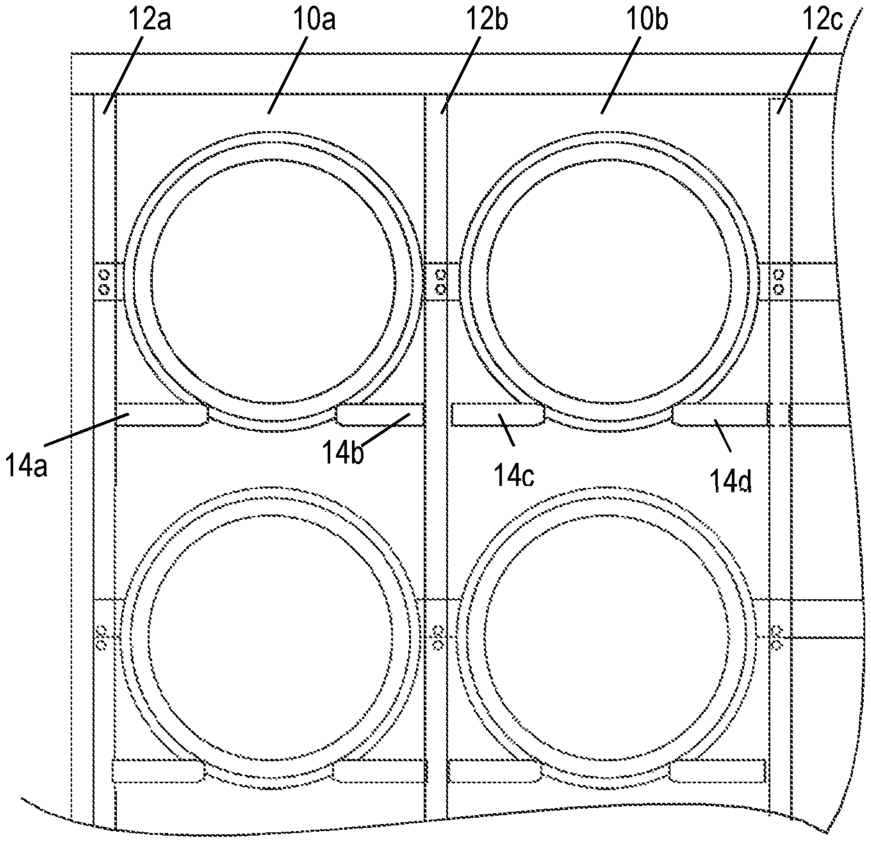
FIG. 2B illustrates an exemplary exploded view of a plurality of sections of the storage rack illustrated in FIG. 2A, according to an aspect of the invention.

FIG. 2A illustrates an exemplary storage rack 200, according to an aspect of the invention. In the storage rack 200 depicted in FIG. 2A, the shared second vertical support 12*b* may be substantially solid. FIG. 2B illustrates an exemplary exploded view of a plurality of sections of the storage rack illustrated in FIG. 2A, according to an aspect of the invention. As shown in FIG. 2B, the second horizontal support 14*b* and the third horizontal support 14*c* may be separate pieces. The second horizontal support 14*b* may be fixably attached to the second vertical support 12*b*, may be integrated with the second vertical support 12*b*, and/or may otherwise be connected to the second vertical support 12*b*. In an implementation in which the shared second vertical support 12*b* is substantially solid, the first set of horizontal supports 14*a*, 14*b* of the first section 10*a* may be disposed at a first height of the first section 10*a* and the second set of horizontal supports 14*c* 14*d* of the second section 10*b* may be disposed at a second height different from the first height.

In one implementation, the vertical supports 12*a*, 12*b*, . . . , 12*n* of the plurality of sections 10*a*, 10*b*, . . . , 10*n* may be connected to one or more of a base 50 of the storage rack 100*a* or a back wall 60 of the storage rack 100*a*.

Figure 3A:
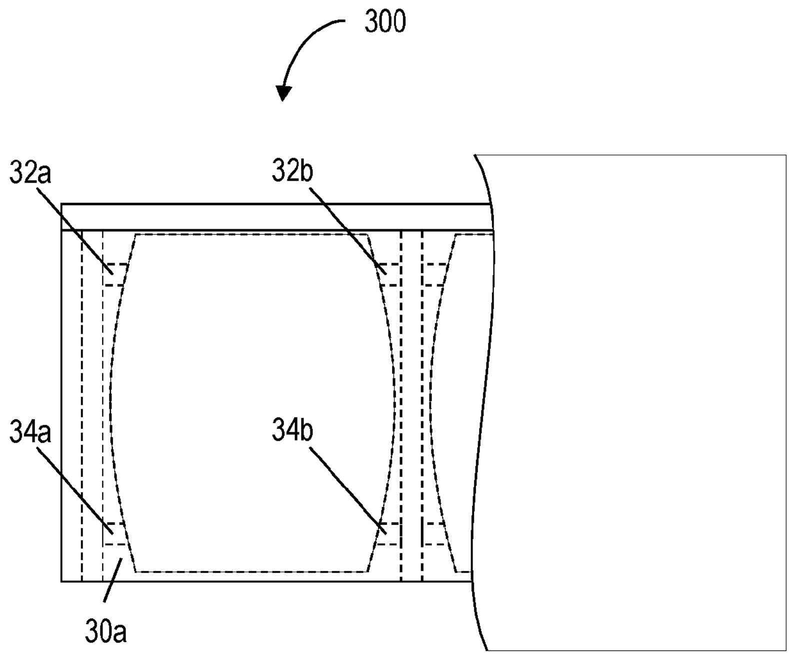
FIG. 3A illustrates an exemplary top view of a section of a storage rack, according to an aspect of the invention.
Figure 3B:
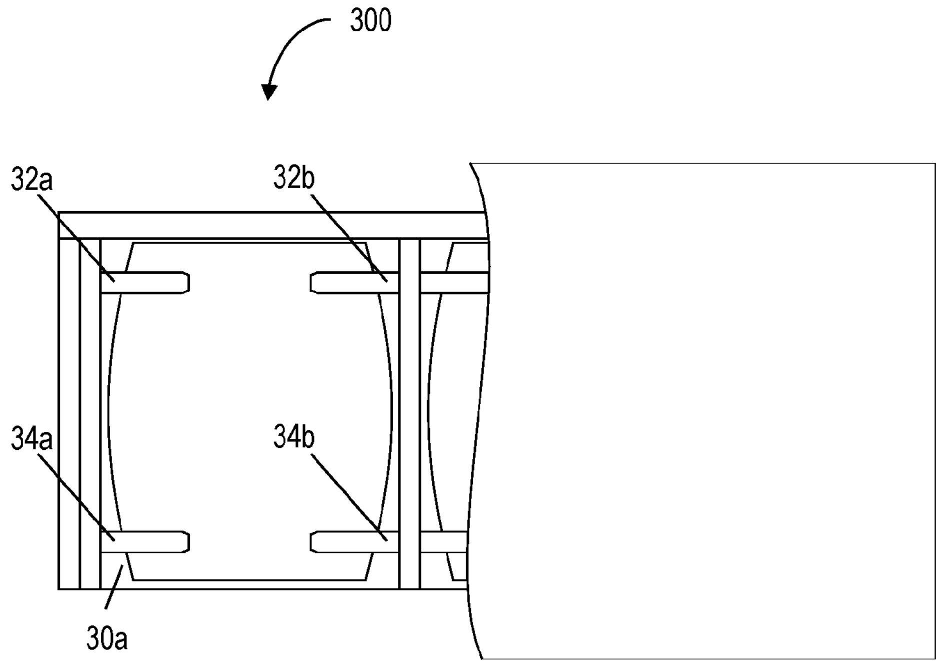
FIG. 3B illustrates an exemplary bottom view of the section of FIG. 3A, according to an aspect of the invention.

FIG. 3A illustrates an exemplary top view of a section of a storage rack 300, according to an aspect of the invention. FIG. 3B illustrates an exemplary bottom view of the section of FIG. 3A, according to an aspect of the invention. As shown in FIGS. 3A and 3B, a first section 30*a* may comprise one or more sets of horizontal supports 32*a*, 32*b*, 34*a*, 34*b*. For example, the first section 30*a* may comprise two sets of horizontal supports 32*a*, 32*b*, 34*a*, 34*b*, each at a same height of the first section 30*a*. In one example, the two sets of horizontal supports 32*a*, 32*b*, 34*a*, 34*b* may be spaced equally apart with respect to a depth of the first section 30*a*. In another example, the two sets of horizontal supports 32*a*, 32*b*, 34*a*, 34*b* may each be spaced an equal distance from a respective front and back of the first section 30*a*. The two sets of horizontal supports 32*a*, 32*b*, 34*a*, 34*b* may be disposed at other locations in the section 30*a* section as well. The locations of the two sets of horizontal supports 32*a*, 32*b*, 34*a*, 34*b* are not limited to the examples described herein.

Figure 4:
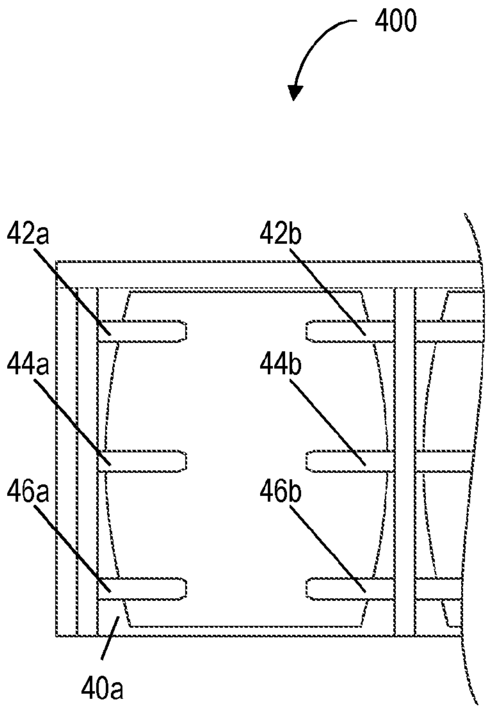
FIG. 4 illustrates an exemplary bottom view of a section of an alternate storage rack, according to an aspect of the invention.

FIG. 4 illustrates an exemplary bottom view of a section of an alternate storage rack 400, according to an aspect of the invention. As shown in FIG. 4, a first section 40*a* may comprise three sets of horizontal supports 42*a*, 42*b*, 44*a*, 44*b*, 46*a*, 46*b*, with each set of horizontal supports at a same height of the first section 10*a*. In one example, the three sets of horizontal supports 42*a*, 42*b*, 44*a*, 44*b*, 46*a*, 46*b* may be spaced equally apart with respect to a depth of the first section 40*a*. In another example, a first set of horizontal supports 44*a*, 44*b* of the three sets of horizontal supports 42*a*, 42*b*, 44*a*, 44*b*, 46*a*, 46*b* may be spaced at a central depth of the section and the other two sets of horizontal supports 42*a*, 42*b*, 46*a*, 46*b* may each be spaced an equal distance from a respective front and back of the first section 10*a*. The three sets of horizontal supports 42*a*, 42*b*, 44*a*, 44*b*, 46*a*, 46*b* may be disposed at other locations in the first section 40*a* as well. The locations of the three sets of horizontal supports 42*a*, 42*b*, 44*a*, 44*b*, 46*a*, 46*b* are not limited to the examples described herein.

Figure 5:
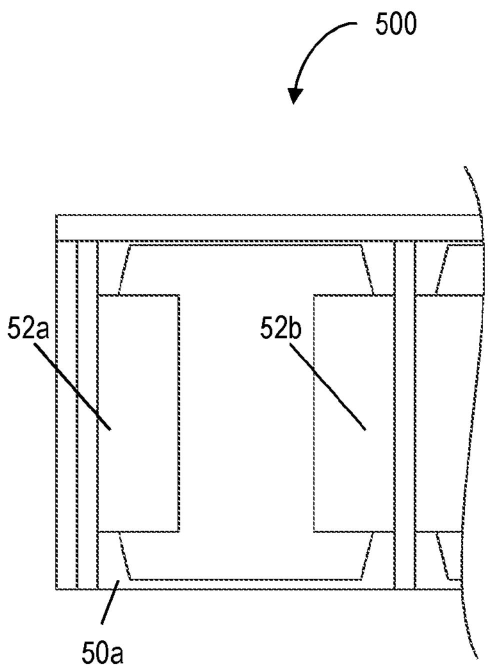
FIG. 5 illustrates an exemplary bottom view of a section of another alternate storage rack, according to an aspect of the invention.

FIG. 5 illustrates an exemplary bottom view of a section of another alternate storage rack 500, according to an aspect of the invention. As shown in FIG. 5, a first section 50*a* may comprise a single set of horizontal supports 52*a*, 52*b*. In one example, a proximal end and a distal end of the single set of horizontal supports 52*a*, 52*b* may be spaced an equal distance from a respective front and back of the first section 10*a*. The single set of horizontal supports 52*a*, 52*b* may be disposed at other locations in the first section 50*a* as well. The locations of the single set of horizontal supports 52*a*, 52*b* are not limited to the examples described herein.

In one implementation, a width of a horizontal support 14*a* may vary from a first section 10*a* to a second section 10*b*. For example, a width of a horizontal support may be based upon one or more of a number of sets of horizontal supports in the section, an average weight of an item to be held by the section, a depth of the section, and/or other parameters related to the section.

A first section 10*a* may be configured to hold a first item. For example, the first item may be a container such as a barrel, a cask, and/or other storage device. The container may be configured to hold one or more items. For example, the container may comprise a cylindrical structure configured to hold liquids, such as distilled spirits, wines, and/or other liquids that need to be "aged". In another example, the container may be configured to store any number and variety of items. A container may have a cylindrical shape, a circular shape, a cube shape, a cuboid shape, an ovoid shape, and/or any other shape.

Figure 6:
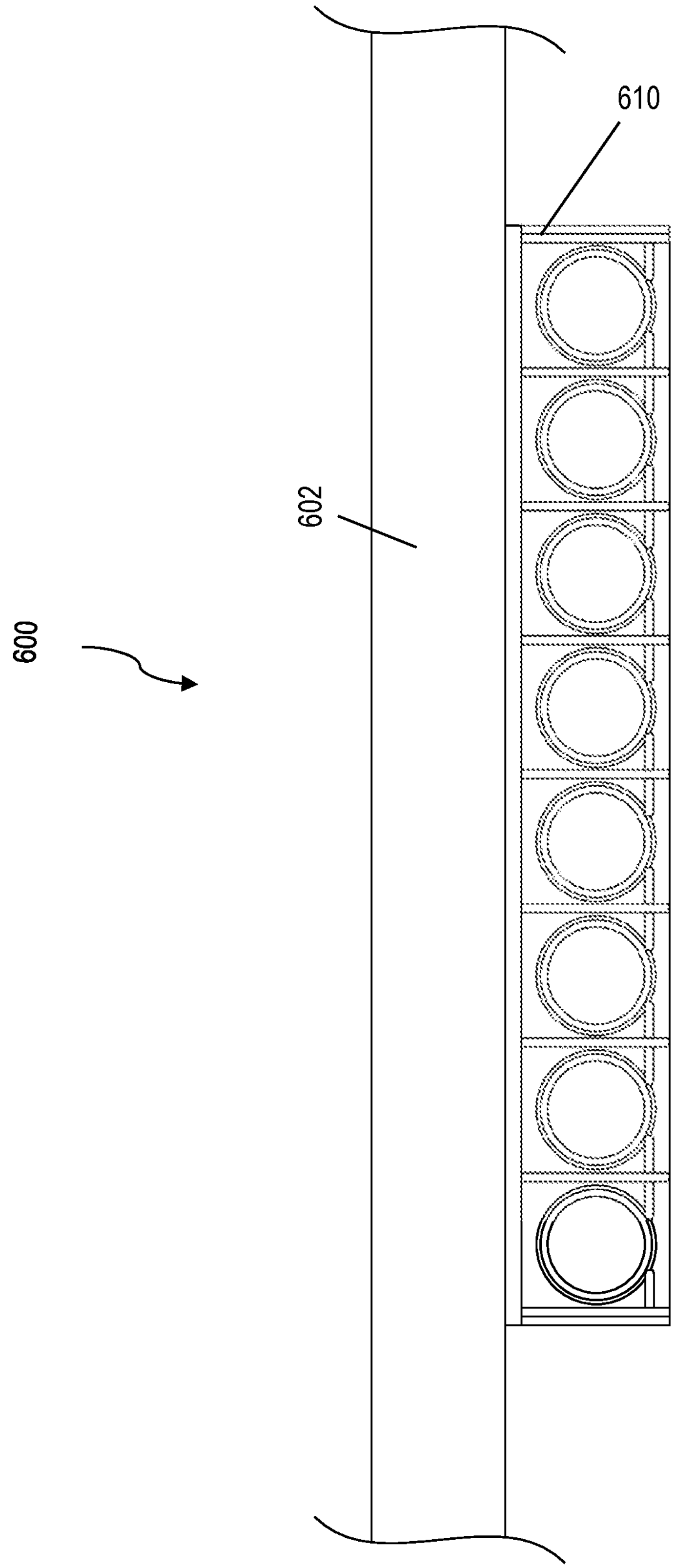
FIG. 6 illustrates an exemplary view of a storage rack attached to a ceiling, according to an aspect of the invention.

Referring back to FIG. 1, the storage rack 100*a* may comprise one or more rows comprising the plurality of sections. FIG. 6 illustrates an exemplary view of a storage rack 600 attached to a ceiling 602, according to an aspect of the invention. As shown in FIG. 6, a topmost row 610 of the storage rack 600 may be fixably attached to a ceiling 602 of a room. For example, the storage rack 600 may comprise a single row fixably attached to a ceiling 602 of a retail environment. In one example, the storage rack 600 may be attached to the ceiling 602 at a focal point of the retail environment, such as behind a counter housing one or more point of sale devices, opposite an entrance of the retail environment, and/or at other locations in the retail environment. The storage rack 600 may store, for example, a plurality of barrels of distilled spirits for display.

Figure 7:
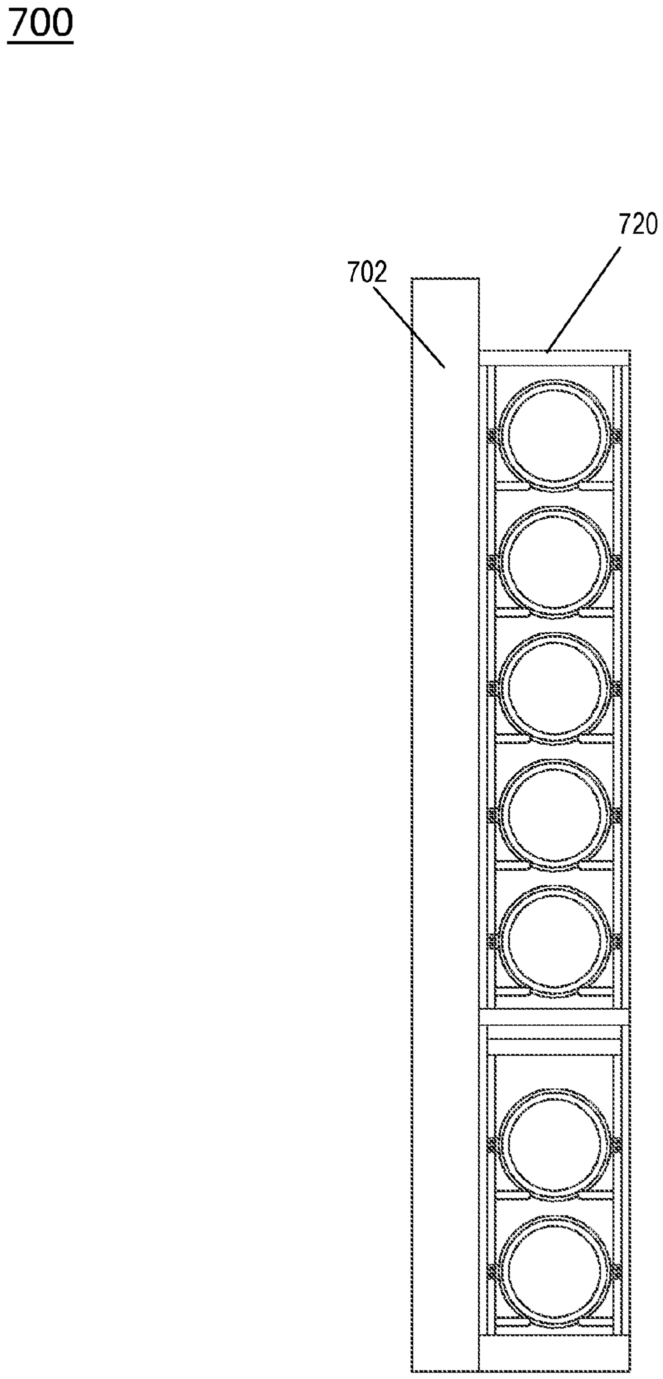
FIG. 7 illustrates an exemplary view of a storage rack attached to a wall, according to an aspect of the invention.

Referring back to FIG. 1, the storage rack 100*a* may comprise one or more columns comprising the plurality of sections. FIG. 7 illustrates an exemplary view of a storage rack 700 attached to a wall 702, according to an aspect of the invention. As shown in FIG. 7, one of the rightmost column or the leftmost column of the storage rack 700 may be fixably attached to a wall 702 of a room. For example, the storage rack 700 may comprise a single row fixably attached to a wall 702 of a retail environment. In one example, the storage rack 600 may be attached to the wall 702 at a focal point of the retail environment, such as near an entrance to the retail environment, near a point of sale device, and/or at another location in the retail environment. The storage rack 700 may store, for example, a plurality of barrels of distilled spirits for display.

Figure 8:
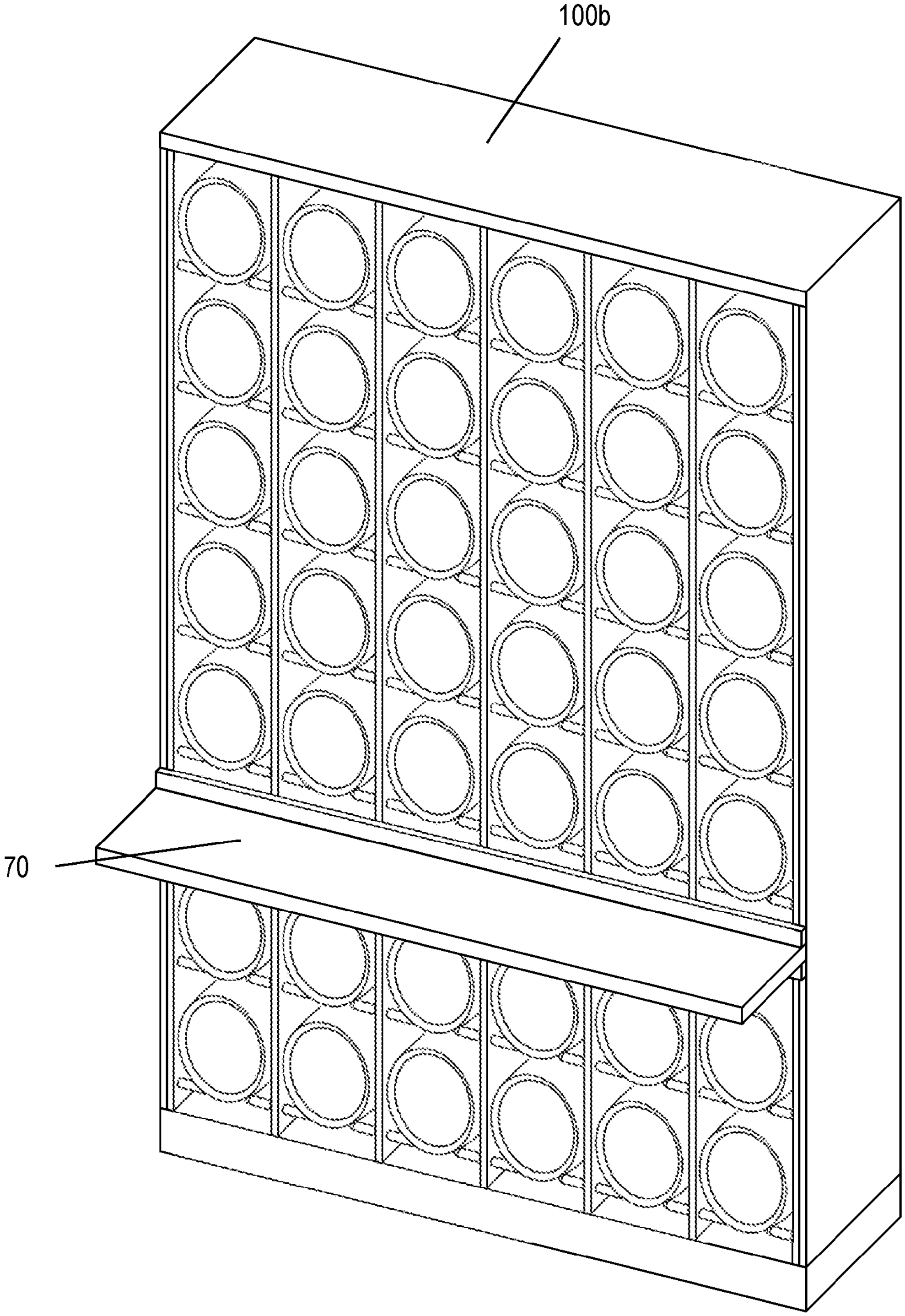
FIG. 8 illustrates an exemplary view of a storage rack comprising a platform, according to an aspect of the invention.

FIG. 8 illustrates an exemplary view of a storage rack 100*b* comprising a platform 70, according to an aspect of the invention. The storage rack 100*b* may be substantially similar to the storage rack 100*a*. As shown in FIG. 8, the storage rack 100*b* may also comprise a platform 70 extending from a front of the storage rack 100*b*. The platform 70 may comprise a substantially flat planar surface substantially parallel to the ground. For example, the platform 70 may comprise a substantially horizontal surface upon which one or more items may be placed.

Figure 9:
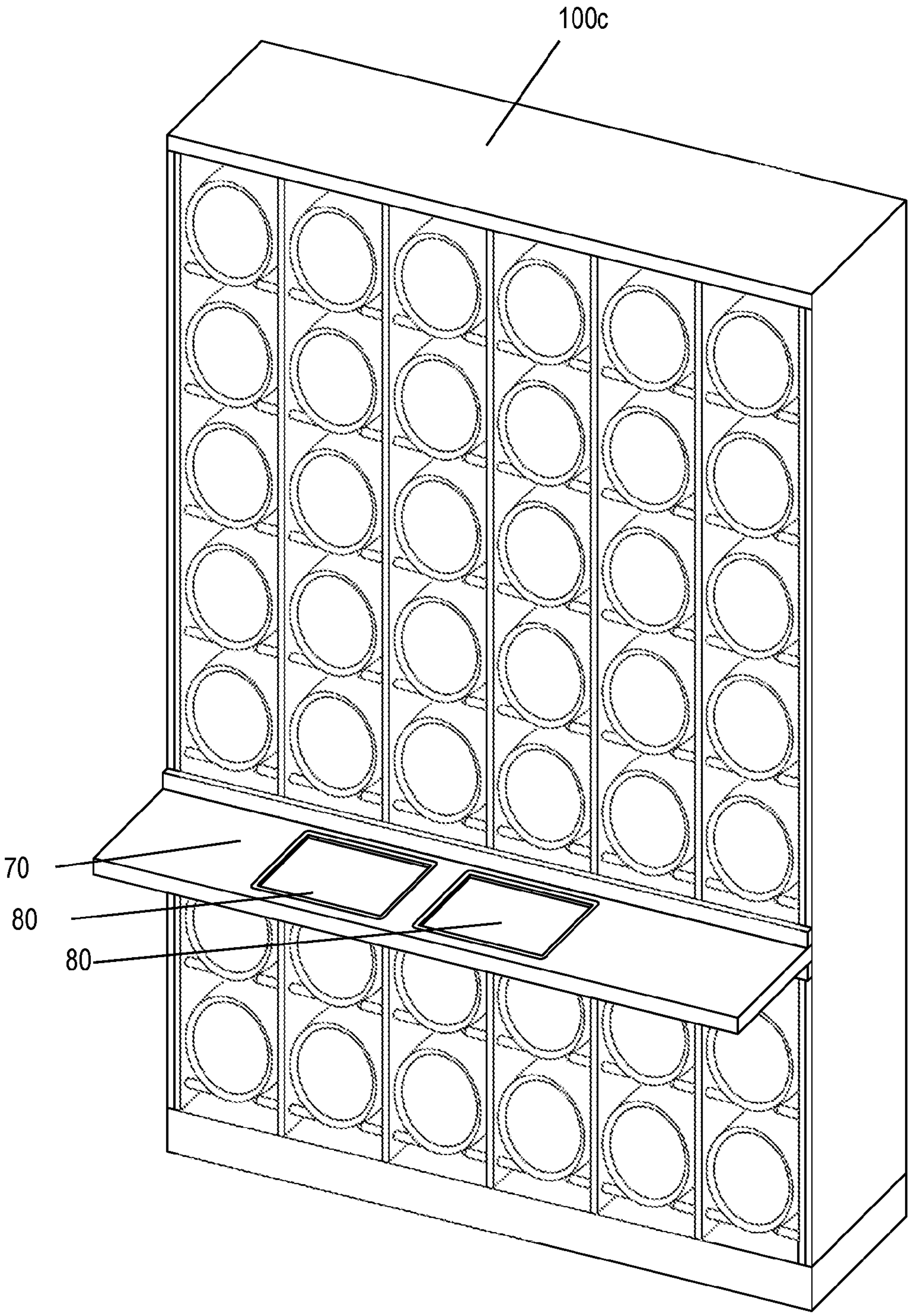
FIG. 9 illustrates an exemplary view of a storage rack comprising a platform with an embedded display, according to an aspect of the invention.
Figure 10:
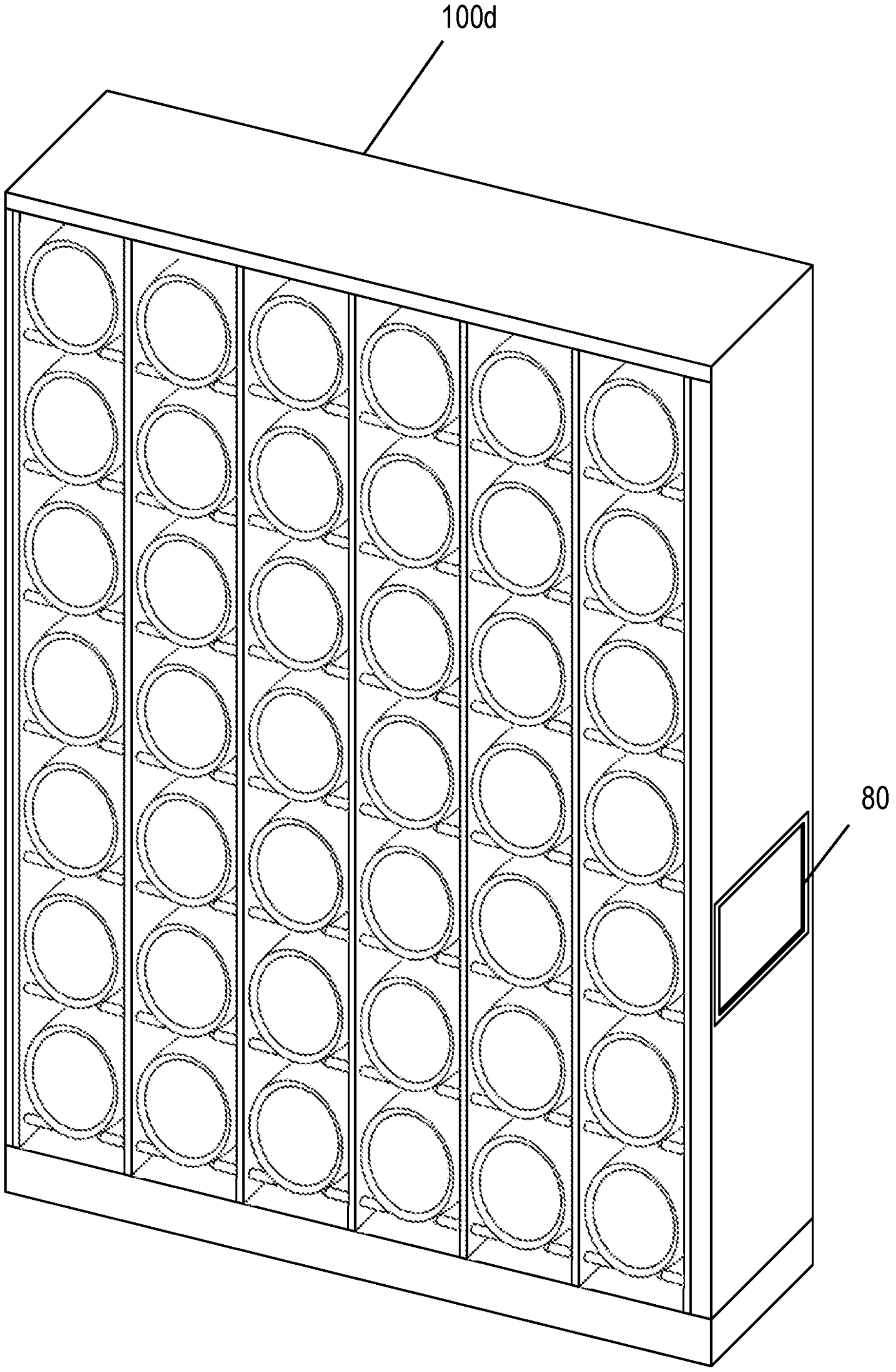
FIG. 10 illustrates an exemplary view of a storage rack comprising an embedded display, according to an aspect of the invention.

FIG. 9 illustrates an exemplary view of a storage rack 100*c* comprising a platform 70 with an embedded display 80, according to an aspect of the invention. The storage rack 100*c* may be substantially similar to the storage rack 100*b*, and may also comprise an embedded display 80 in the platform 70. For example, the storage rack 100*d* may comprise one or more embedded displays 80 in the platform. FIG. 10 illustrates an exemplary view of a storage rack 100*d* comprising an embedded display 80, according to an aspect of the invention. As shown in FIG. 10, an external side wall of the storage rack 100*d* may comprise one or more embedded displays. A first embedded display 80 may comprise the functionality of a kiosk at which information may be displayed. In one implementation, a first embedded display 80 may comprise a kiosk having an interactive display. For example, the kiosk may be the same or similar to the kiosk described in U.S. patent application Ser. No. 13/750,925, which is hereby incorporated by reference in its entirety. The storage rack 100*d* may comprise one or more embedded displays 80 in the platform and one or more embedded displays 80 in an external side wall of the storage rack 100*d*.

In one implementation, a storage rack (e.g., storage rack 100*a*, 100*b*, 100*c*, 100*d*, and/or another storage rack) may store barrels for aging spirits in a retail environment. The retail environment may comprise equipment that enables a customer to participate in the production of customized spirits. The customized spirits may be stored in a barrel stored in the storage rack. As such, in one implementation, the barrels stored in the storage rack may correspond to barrels of customized spirits produced by one or more customers in the retail environment.

In one implementation, the storage rack may comprise one or more embedded displays disposed, for example, at a platform of the storage rack, at an external wall of the storage rack, on one or more barrels stored in the storage rack, and/or at other locations of the storage rack. One or more types of embedded displays may be disposed at the storage rack. The types of embedded displays may include, for example, an electronic display, a print display, and/or other type of display. The electronic display may facilitate the access of electronic data related to the retail environment, the barrels stored, a specific barrel, available distilled spirits in the stored barrels, the customization process associated with the distilled spirits held by a specific barrel, the production and/or customization of distilled spirits, information related to production of distilled spirits, education regarding distilled spirits, the barrels stored by the storage rack, users associated with the retail environment, batch management information related to one or more barrels stored at the storage rack, and/or other information related to the retail environment and/or its products.

In one implementation, a barrel stored in the storage rack may comprise identification information displayed thereon. The identification information may be used to access information related to the barrel, including one or more customers associated with the barrel, a customization process associated with the barrel, batch management information associated with the barrel, distilled spirits associated with the barrel, and/or other information associated with the barrel. In one implementation, information displayed via an embedded display may be updated via the embedded display. A print display may be established via interaction with a kiosk at the retail environment or another embedded display of the storage rack.

Aspects and implementations described herein as including a particular feature, structure, or characteristic, but every aspect or implementation may not necessarily include the particular feature, structure, or characteristic. Further, when a particular feature, structure, or characteristic is described in connection with an aspect or implementation, it will be understood that such feature, structure, or characteristic may be included in connection with other aspects or implementations, whether or not explicitly described. Thus, various changes and modifications may be made to the provided description without departing from the scope or spirit of the invention. As such, the specification and drawings should be regarded as exemplary only, and the scope of the invention to be determined solely by the appended claims.

What is claimed is:

1. A storage rack for supporting a plurality of barrels, the storage rack comprising:

a first vertical support comprising at least a first through hole and a second through hole, the first through hole having inserted therein a proximal end of a first horizontal support, and the second through hole having inserted therein a proximal end of a second horizontal support;

a second vertical support, oriented substantially parallel to the first vertical support, comprising at least a third through hole and a fourth through hole, the third through hole having inserted therethrough a third horizontal support, and the fourth through hole having inserted therethrough a fourth horizontal support; and a third vertical support, oriented substantially parallel to the first and second vertical supports, comprising at least a fifth through hole and a sixth through hole, the fifth through hole having inserted therein a distal end of a fifth horizontal support, and the sixth through hole having inserted therein a distal end of a sixth horizontal support;

wherein the first through hole, the second through hole, the third through hole, the fourth through hole, the fifth through hole, and the sixth through hole are each arranged at a same first height;

wherein a distal end of the first horizontal support, a distal end of the second horizontal support, a proximal end of the third horizontal support, and a proximal end of the fourth horizontal support together hold a first barrel in a first section of the storage rack, the distal end of each of the first horizontal support and the second horizontal support being located between the first vertical support and the second vertical support, and the proximal end of each of the third horizontal support and the fourth horizontal support being located between the first vertical support and the second vertical support; and wherein a distal end of the third horizontal support, a distal end of the fourth horizontal support, a proximal end of the fifth horizontal support, and a proximal end of the sixth horizontal support together hold a second barrel in a second section of the storage rack, the distal end of each of the third horizontal support and the fourth horizontal support being located between the second vertical support and the third vertical support, and the proximal end of each of the fifth horizontal support and the sixth horizontal support being located between the second vertical support and the third vertical support.

2. The storage rack of claim 1, wherein the first through hole, the third through hole, and the fifth through hole are arranged coaxially; and wherein the second through hole, the fourth through hole, and the sixth through hole are arranged coaxially.

3. The storage rack of claim 1, wherein the first through hole, the third through hole, and the fifth through hole are arranged at a first depth in the first vertical support, the second vertical support, and the third vertical support, respectively; and wherein the second through hole, the fourth through hole, and the sixth through hole are arranged at a second depth in the first vertical support, the second vertical support, and the third vertical support, respectively.

4. The storage rack of claim 1, wherein the distal ends of the first and second horizontal support are located closer to the first vertical support than the second vertical support.

5. The storage rack of claim 1, wherein:

the first vertical support further includes at least a seventh through hole and an eighth through hole arranged at a same second height that is different from the first height of the first through hole and the second through hole, the seventh through hole having inserted therein a proximal end of a seventh horizontal support, and the eighth through hole having inserted therein a proximal end of an eighth horizontal support;

the second vertical support further includes at least a ninth through hole and a tenth through hole arranged at the second height, the ninth through hole having inserted therethrough a ninth horizontal support, and the tenth through hole having inserted therethrough a tenth horizontal support; and the third vertical support further includes at least an eleventh through hole and a twelfth through hole arranged at the second height, the eleventh through hole having inserted therein a distal end of an eleventh horizontal support, and the twelfth through hole having inserted therein a distal end of a twelfth horizontal support;

wherein a distal end of the seventh horizontal support, a distal end of the eighth horizontal support, a proximal end of the ninth horizontal support, and a proximal end of the tenth horizontal support together hold a third barrel in a third section of the storage rack, the distal end of each of the seventh horizontal support and the eighth horizontal support being located between the first vertical support and the second vertical support, and the proximal end of each of the ninth horizontal support and the tenth horizontal support being located between the first vertical support and the second vertical support; and wherein a distal end of the ninth horizontal support, a distal end of the tenth horizontal support, a proximal end of the eleventh horizontal support, and a proximal end of the twelfth horizontal support together hold a fourth barrel in a fourth section of the storage rack, the distal end of each of the ninth horizontal support and the tenth horizontal support being located between the second vertical support and the third vertical support, and the proximal end of each of the eleventh horizontal support and the twelfth horizontal support being located between the second vertical support and the third vertical support.

6. The storage rack of claim 1, further comprising:

a platform fixably attached to a front of the storage rack, the platform comprising a substantially flat planar surface.

7. The storage rack of claim 6, wherein the platform comprises a first embedded display configured to provide an interactive display of information.

8. The storage rack of claim 1, wherein the storage rack is disposed in a retail environment in which a customer may participate in preparing customized distilled spirits.

9. The storage rack of claim 1, further comprising:

a fourth vertical support having an external side wall that includes an embedded display configured to provide an interactive display of information.

10. A storage rack for supporting a plurality of barrels, the rack comprising:

a first vertical support including a first plurality of through holes that are arranged vertically at a first depth in the first vertical support, and a second plurality of through holes that are arranged vertically at a second depth in the first vertical support;

a second vertical support, oriented substantially parallel to the first vertical support, including a third plurality of through holes that are arranged vertically at the first depth in the second vertical support, and a fourth plurality of through holes that are arranged vertically at the second depth in the second vertical support;

a third vertical support, oriented substantially parallel to the first and second vertical supports, including a fifth plurality of through holes that are arranged vertically at the first depth in the third vertical support, and a sixth plurality of through holes that are arranged vertically at the second depth in the third vertical support;

a first set of horizontal supports arranged in the first plurality of through holes of the first vertical support and extending perpendicularly to the first vertical support in a direction toward the second vertical support, wherein the first set of horizontal supports extends less than half of the separation distance between the first vertical support and the second vertical support in the direction toward the second vertical support;

a second set of horizontal supports arranged in the second plurality of through holes of the first vertical support and extending perpendicularly to the first vertical support in a direction toward the second vertical support, wherein the second set of horizontal supports extends less than half of the separation distance between the first vertical support and the second vertical support in the direction toward the second vertical support;

a third set of horizontal supports arranged in the third plurality of through holes of the second vertical support and extending perpendicularly to the second vertical support on both sides of the second vertical support, wherein the third set of horizontal supports extends less than half of the separation distance between the first vertical support and the second vertical support in the direction toward the first vertical support, and less than half of the separation distance between the second vertical support and the third vertical support in the direction toward the third vertical support;

a fourth set of horizontal supports arranged in the fourth plurality of through holes of the second vertical support and extending perpendicularly to the second vertical support on both sides of the second vertical support, wherein the fourth set of horizontal supports extends less than half of the separation distance between the first vertical support and the second vertical support in the direction toward the first vertical support, and less than half of the separation distance between the second vertical support and the third vertical support in the direction toward the third vertical support;

a fifth set of horizontal supports arranged in the fifth plurality of through holes of the third vertical support and extending perpendicularly to the third vertical support in a direction toward the second vertical support, wherein the fifth set of horizontal supports extends less than half of the separation distance between the second vertical support and the third vertical support in the direction toward the second vertical support;

a sixth set of horizontal supports arranged in the sixth plurality of through holes of the third vertical support and extending perpendicularly to the third vertical support in a direction toward the second vertical support, wherein the sixth set of horizontal supports extends less than half of the separation distance between the second vertical support and the third vertical support in the direction toward the second vertical support;

wherein respective individual horizontal supports of the first, second, third, and fourth set of horizontal supports are each arranged at a same first height, and together hold a first barrel from the plurality of barrels; and wherein respective individual horizontal supports of the third, fourth, fifth, and sixth set of horizontal supports are each arranged at the first height, and together hold a second barrel from the plurality of barrels.

11. The storage rack of claim 10, wherein respective ones of the first plurality of through holes are arranged coaxially with respective ones of the third plurality of through holes and respective ones of the fifth plurality of through holes, and wherein respective ones of the second plurality of through holes are arranged coaxially with respective ones of the fourth plurality of through holes and respective ones of the sixth plurality of through holes.

12. The storage rack of claim 10, wherein second respective individual horizontal supports of the first, second, third, and fourth set of horizontal supports are each arranged at a same second height, and together hold a third barrel from the plurality of barrels at the second height which is different than the height of the first barrel; and wherein respective individual horizontal supports of the third, fourth, fifth, and sixth set of horizontal supports are each arranged at the second height, and together hold a fourth barrel from the plurality of barrels at the second height which is different than the height of the second barrel.

13. The storage rack of claim 10, further comprising:

a platform fixably attached to a front of the storage rack, the platform comprising a substantially flat planar surface.

14. The storage rack of claim 13, wherein the platform comprises a first embedded display configured to provide an interactive display of information.

15. The storage rack of claim 10, wherein the storage rack is disposed in a retail environment in which a customer may participate in preparing customized distilled spirits.

16. The storage rack of claim 10, further comprising a fourth vertical support having an external side wall that includes an embedded display configured to provide an interactive display of information.

* * * * *